(12) United States Patent
Oliver et al.

(10) Patent No.: US 11,342,493 B2
(45) Date of Patent: May 24, 2022

(54) HIGH COHERENCE, SMALL FOOTPRINT SUPERCONDUCTING QUBIT MADE BY STACKING UP ATOMICALLY THIN CRYSTALS

(71) Applicant: Massachusetts Institute of Technology, Cambridge, MA (US)

(72) Inventors: William D. Oliver, Arlington, MA (US); Simon Gustavsson, Cambridge, MA (US); I-Jan Wang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 33 days.

(21) Appl. No.: 17/106,562

(22) Filed: Nov. 30, 2020

(65) Prior Publication Data

US 2021/0343923 A1    Nov. 4, 2021

Related U.S. Application Data

(60) Provisional application No. 62/954,913, filed on Dec. 30, 2019.

(51) Int. Cl.
*H01L 39/22* (2006.01)
*G06N 10/00* (2022.01)
*H01L 39/24* (2006.01)
*H01L 39/02* (2006.01)

(52) U.S. Cl.
CPC .......... *H01L 39/223* (2013.01); *G06N 10/00* (2019.01); *H01L 39/025* (2013.01); *H01L 39/2416* (2013.01); *H01L 39/2493* (2013.01)

(58) Field of Classification Search
CPC . H01L 39/223; H01L 39/025; H01L 39/2416; H01L 39/2493
See application file for complete search history.

(56) References Cited

U.S. PATENT DOCUMENTS

2021/0020744 A1* 1/2021 Duan ................... H01L 51/0558
2021/0217946 A1* 7/2021 Lee ......................... H01L 39/12

FOREIGN PATENT DOCUMENTS

WO    WO 2018/236374 A1    12/2018

OTHER PUBLICATIONS

Yabuki, N., Moriya, R., Arai, M. et al. Supercurrent in van der Waals Josephson junction. Nat Commun 7, 10616 (2016). https://doi.org/10.1038/ncomms10616 (Year: 2016).*

* cited by examiner

*Primary Examiner* — Matthew L Reames
(74) *Attorney, Agent, or Firm* — Daly, Crowley, Mofford & Durkee LLP

(57) ABSTRACT

A superconducting qubit is manufactured by stacking up atomically-thin, crystalline monolayers to form a heterostructure held together by van der Waals forces. Two sheets of superconducting material are separated by a third, thin sheet of dielectric to provide both a parallel plate shunting capacitor and a Josephson tunneling barrier. The superconducting material may be a transition metal dichalcogenide (TMD), such as niobium disilicate, and the dielectric may be hexagonal boron nitride. The qubit is etched, or material otherwise removed, to form a magnetic flux loop for tuning. The heterostructure may be protected by adhering additional layers of the dielectric or other insulator on its top and bottom. For readout, the qubit may be coupled to an external resonator, or the resonator may be integral with one of the sheets of superconducting material.

20 Claims, 5 Drawing Sheets

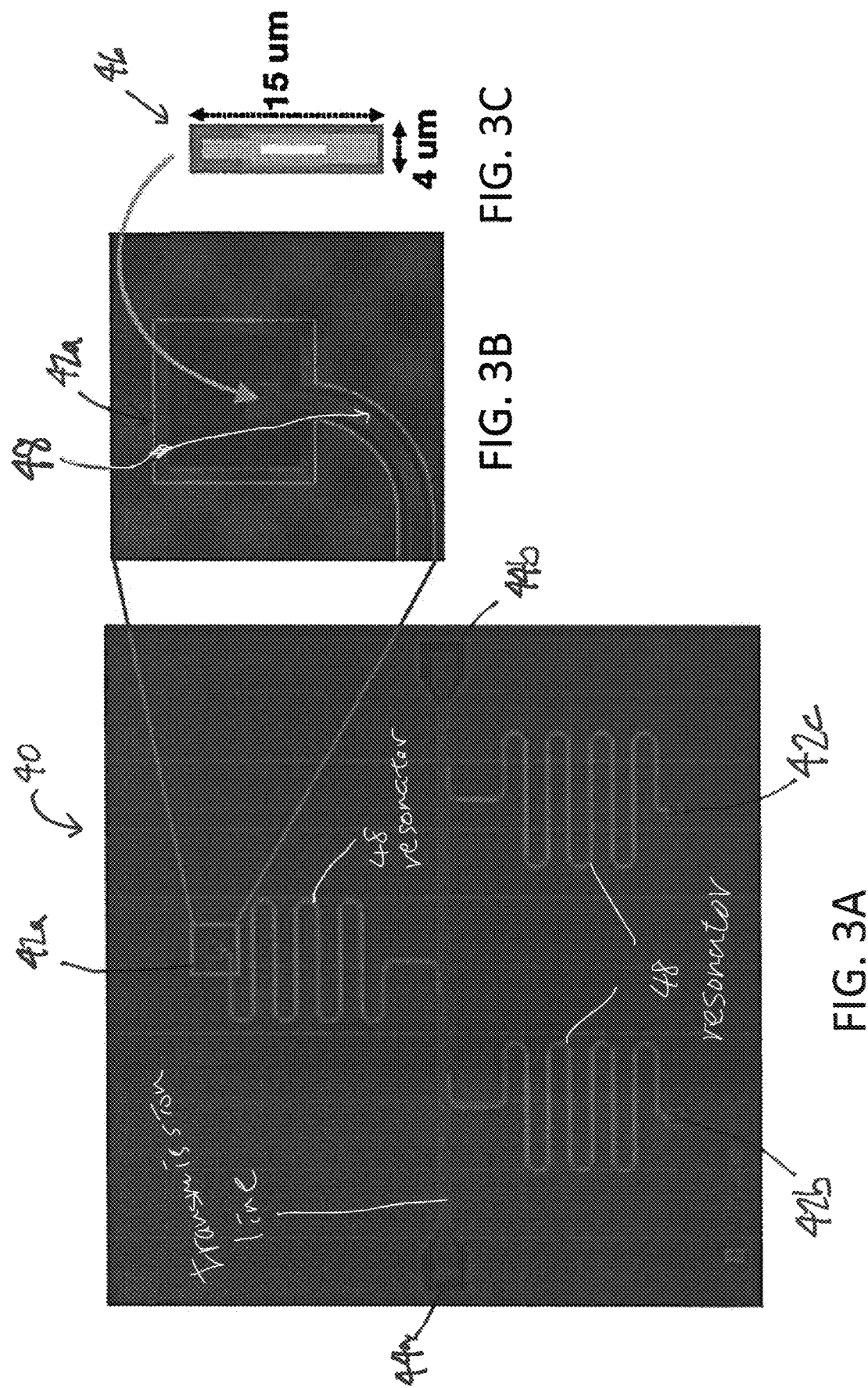

HIGH COHERENCE, SMALL FOOTPRINT SUPERCONDUCTING QUBIT MADE BY STACKING UP ATOMICALLY THIN CRYSTALS

CROSS-REFERENCE TO RELATED APPLICATION

This application claims the benefit of U.S. Provisional Application No. 62/954,913, filed Dec. 30, 2019, whose contents are incorporated by reference herein in their entirety.

GOVERNMENT LICENSE RIGHTS

This invention was made with Government support under Grant No. W911NF-18-1-0116 awarded by the Army Research Office. The Government has certain rights in the invention.

FIELD

The disclosure pertains generally to superconducting qubits, and more particularly to qubits and supporting circuitry formed from crystalline monolayers.

BACKGROUND

Quantum computers promise to deliver computing power that will surpass any existing supercomputer in the near future. They will bring tremendous impacts to areas such as security, the pharmaceutical industry, quantum chemistry simulation, optimization, and artificial intelligence (AI). Quantum machines that contain thousands or even millions of qubits are necessary to realize this goal.

A superconducting qubit, the fundamental component of a quantum computer, consists of Josephson junctions, shunting inductors, and a shunting capacitor, which are composed of superconducting and insulating materials. Currently, superconducting qubits are fabricated out of a metallic superconductor and a metal oxide serving as the insulating barrier forming the Josephson junctions. These materials are combined together by evaporation and controlled oxidation in a high-vacuum chamber. Devices made with this approach consist of amorphous materials (metal and the oxide layers) with rough interfaces, and both are rich in structural defects known as two-level-systems ("TLSs"). The existence of TLSs in a superconducting qubit is one of the major limiting factors of its coherence time. In addition, to circumvent the effect of TLSs in the dielectrics, current designs of superconducting qubits adopt a coplanar geometry instead of a more compact, parallel plate structure. Although materials-growth methods exist to make epitaxial metals, the subsequent fabrication of these deposited metals into functional devices often introduce defects on the metal surfaces and interfaces that leads to qubit decoherence.

SUMMARY OF DISCLOSED EMBODIMENTS

Disclosed embodiments create high-performance superconducting qubits for a large-scale, highly-extensible quantum computer by stacking up atomic layers of 2-dimensional crystals. Van der Waals ("vdW") materials are defect-free, 2-dimensional crystals with ultra-flat surfaces, and therefore contain very low densities of TLSs in the bulk and at the interfaces. The van der Waals materials can be reduced from a single crystal down to a film as thin as one layer of atoms. By stacking up different kinds of van der Waals materials, illustratively using the dry-polymer approach, one can preserve the structural and functional integrity of the constituent materials. This approach allows one to build an epitaxially precise device. Embodiments of the concepts, techniques, and structures disclosed herein use 2-dimensional van der Waals materials to build Josephson junctions and a shunting capacitor, thereby forming a qubit. This approach may lead to new types of qubits with longer coherences (functional lifetimes) as compared to existing devices.

Advantages of embodiments include the following. The charging energy $E_C$ is provided to the qubit by an approximately 10 micron (μm) by 10 μm parallel plate capacitor. The Josephson junction and the capacitor consist of highly crystalized materials, and could be less lossy than existing structures. Also, these components are physically and electrically in parallel and made with a single piece of crystal, so may have reduced interference. The electrical field is largely confined within the capacitor's small volume, which reduces the participation rate of regions having oxides and chemical residues. And the components require conceptually simple fabrication procedures, i.e. only stacking and transferring monolayers, plus a single lithography step to produce the magnetic flux loop of the superconducting quantum interference device (SQUID).

DESCRIPTION OF THE SEVERAL VIEWS OF THE DRAWINGS

The manner and process of making and using the disclosed embodiments may be appreciated by reference to the drawings, in which:

FIG. 3A shows an illustrative circuit for capacitively coupling three qubits according to an embodiment;

FIG. 3B is a detail view of a qubit and resonator portion of FIG. 3A;

FIG. 3C illustrates how the first embodiment may be used as the qubit in FIG. 3B;

DETAILED DESCRIPTION

Figure 1:
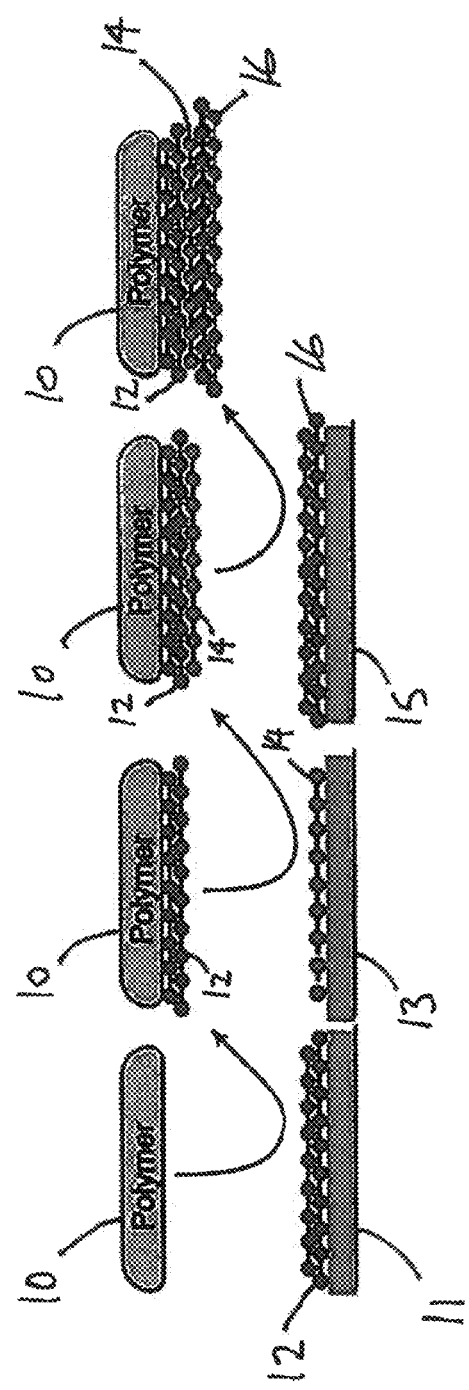
FIG. 1 schematically shows a dry-polymer technique for manufacturing van der Waals (vdW) heterostructures according to an embodiment.

In FIG. 1 is shown a process for manufacturing van der Waals (vdW) heterostructures using crystalline monolayers of planar materials according to the dry-polymer technique. It is appreciated that other techniques may be known or discovered for manufacturing vdW heterostructures in accordance with the concepts, techniques, and structures described herein, and thus the process of FIG. 1 is intended to illustrate only one particular method of forming vdW heterostructures according to an embodiment.

A substrate polymer 10 is provided on which the desired heterostructure is fabricated in stages. Desired vdW monolayers are provided on other substrates and transferred to the polymer 10 using the dry-polymer technique. Thus, by way of illustration, a second substrate 11 provides monolayers of a superconducting transition metal dichalcogenide (TMD) 12 having the chemical formula $MX_2$, where M is a transition metal and X is a chalcogen (i.e. an element in group 16 of the periodic table, other than oxygen). These monolayers of TMD 12 are transferred from the substrate 11 to a surface of the substrate 10 using the dry-polymer technique. Next, a third substrate 13 provides monolayers of hexagonal boron nitride (hBN) 14, which are transferred to a surface of the TMD 12 via the dry-polymer technique. The hBN 14 adheres to the TMD 12 by van der Waals forces. Then, a fourth substrate 15 provides additional monolayers of TMD 16, which are transferred to a surface of the hBN 14 and adhere to the hBN 14 by van der Waals forces. It is appreciated that the substrate 15 may be identical to the substrate 11 in some embodiments. Together, the TMD 12, the hBN 14, and the TMD 16 form a quantum device according to an embodiment.

Embodiments leverage the defect-free nature of vdW materials to create parallel-plate capacitors of exceptionally high quality. The size of such capacitors is about 100 times smaller than those used by current qubits known in the art (for the same capacitance). Therefore, disclosed embodiments advantageously and significantly reduce the footprint of an individual qubit in superconducting circuits, allowing one to pack many more qubits into one chip while preserving superior performance. Implementations have a smaller footprint and reduced control cross-talk when building larger, multi-qubit quantum machines.

Stacking up the vdW materials into a superconductor-insulator-superconductor heterostructure provides both the proper Josephson junction as well as the capacitance necessary to build a qubit. In practical embodiments, this heterostructure may be integrated into a superconducting microwave circuit that allows one to perform qubit control and readout.

Figure 2A:
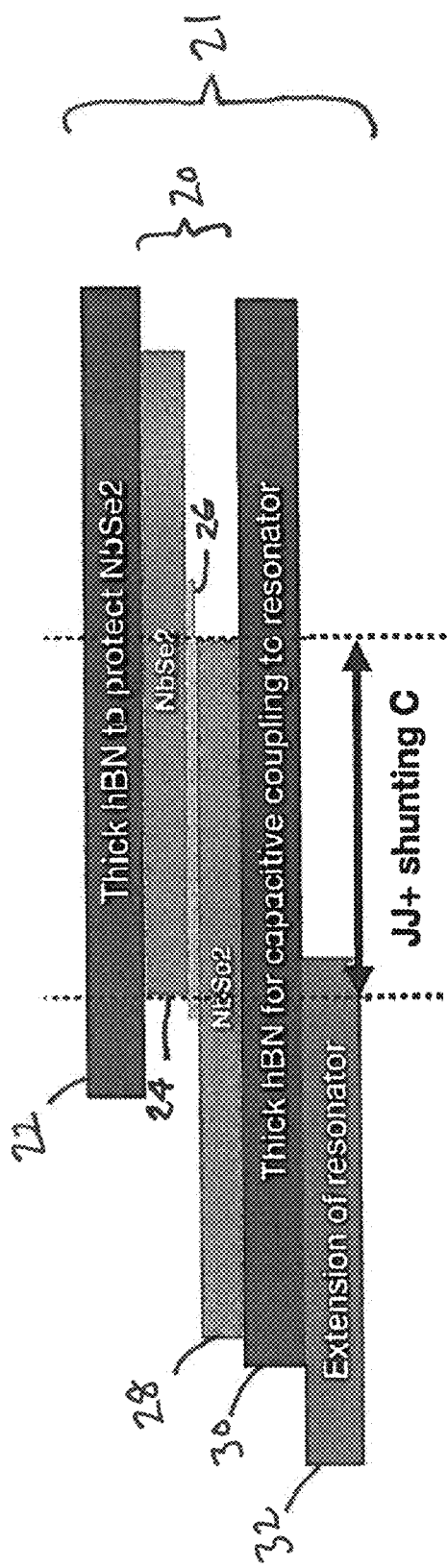
FIGS. 2A and 2B show a side view and a top view, respectively, of a superconducting qubit as a vdW heterostructure according to a first embodiment.
Figure 2B:
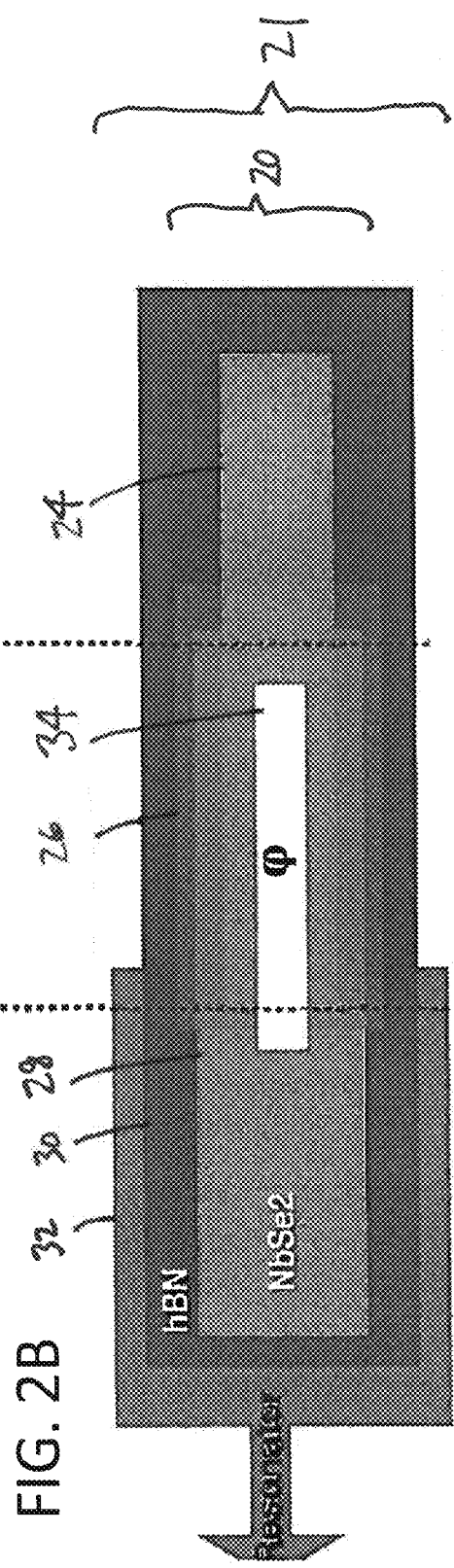

Thus, in FIGS. 2A and 2B (collectively "FIG. 2") are shown a side view and a top view, respectively, of a superconducting qubit 20 as part of a vdW heterostructure 21 according to a first embodiment. In FIG. 2, like structures are labeled with like reference numbers. The heterostructure 21 comprises several sheets, each of which comprises one or more monolayers of a vdW material. In particular, the heterostructure 21 includes a first sheet 22 of insulator, a second sheet 24 of a TMD that exhibits superconductivity below a critical temperature, a third sheet 26 of the insulator, a fourth sheet 28 of the TMD, a fifth sheet 30 of the insulator, and a sixth sheet 32 of a conductor. The sheets 24 and 28 of the TMD and the sheet 26 of the insulator together form the qubit 20, comprising at least one Josephson junction and a shunting capacitor. The first sheet 22 of insulator is not shown in FIG. 2B for clarity.

In illustrative embodiments, the sheets 22, 26, and 30 of insulator are hexagonal boron nitride (hBN). Also, the sheets 24 and 28 of TMD are niobium diselenide ($NbSe_2$). It is appreciated that other embodiments may use different monolayer insulators and different monolayer TMDs to achieve the functions disclosed herein using similar structures via similar manufacturing techniques.

In illustrative embodiments, the sheet 22 of insulator material is relatively thick (e.g. hundreds of monolayers), to protect and electromagnetically isolate the qubit 20 from its substrate. The sheet 30 of insulator also is relatively thick, to capacitively couple the qubit 20 to resonator circuitry of which sheet 32 is a part. By contrast, the sheet 26 of insulator is relatively thin (e.g. 1-5 monolayers) to provide a Josephson tunneling barrier.

To tune the qubit 20, a magnetic flux loop 34 is required. This flux loop 34 may be provided by etching the heterostructure 21, e.g. using reactive ion etching (RIE), at an appropriate point during the manufacturing process. It is appreciated that other techniques known in the art may be used to manufacture the flux loop 34, and that the use of RIE is illustrative only.

In FIGS. 3A to 3C (collectively "FIG. 3") are shown an illustrative circuit 40 for three qubits according to an embodiment. The circuit 40 includes three qubit structures 42a, 42b, and 42c that are capacitively coupled to a transmission line (defined between the two leads 44a and 44b) that may be used for testing the qubits, or for coupling to other parts of a quantum computer (e.g. for controlling the qubit structures 42a, 42b, 42c or reading out states of the qubits contained therein).

Each qubit structure 42a, 42b, 42c is functionally identical; detail of the qubit structure 42a is illustratively shown in FIG. 3B. The qubit structure 42a includes a qubit 46 and a resonator 48, as those components are known in the art of quantum devices. However, in accordance with illustrative embodiments and unlike the prior art, the qubit 46 may be implemented using a superconducting van der Waals heterostructure, shown in FIG. 3C as the embodiment of FIG. 2 (and more particularly as the top view of FIG. 2B, appropriately rotated). FIG. 3C further illustrates typical dimensions of such a qubit, e.g. a length of 15 microns (μm) and a width of 4 μm. These dimensions are shown for illustrative purposes only, and it is appreciated that embodiments of the teachings herein may include qubits 46 having other dimensions.

Figure 4A:
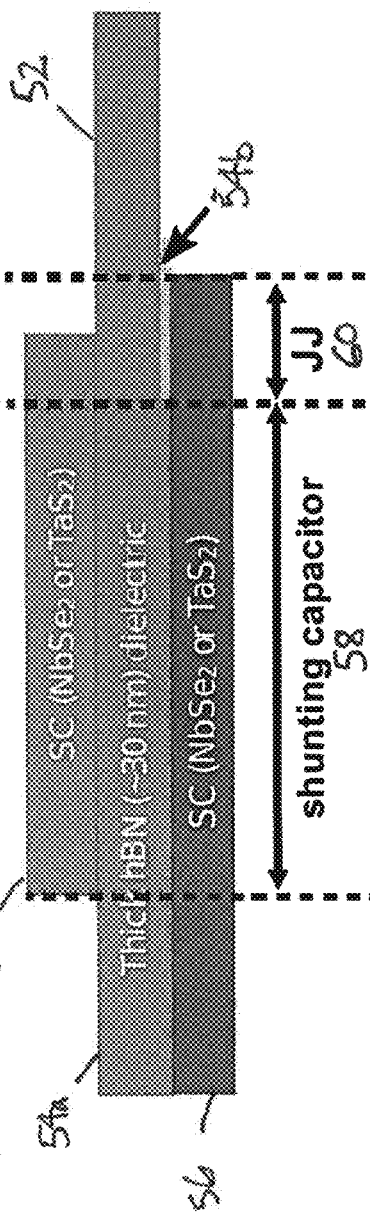
FIGS. 4A and 4B show a side view and a top view, respectively, of a qubit as a vdW heterostructure according to a second embodiment.
Figure 4B:
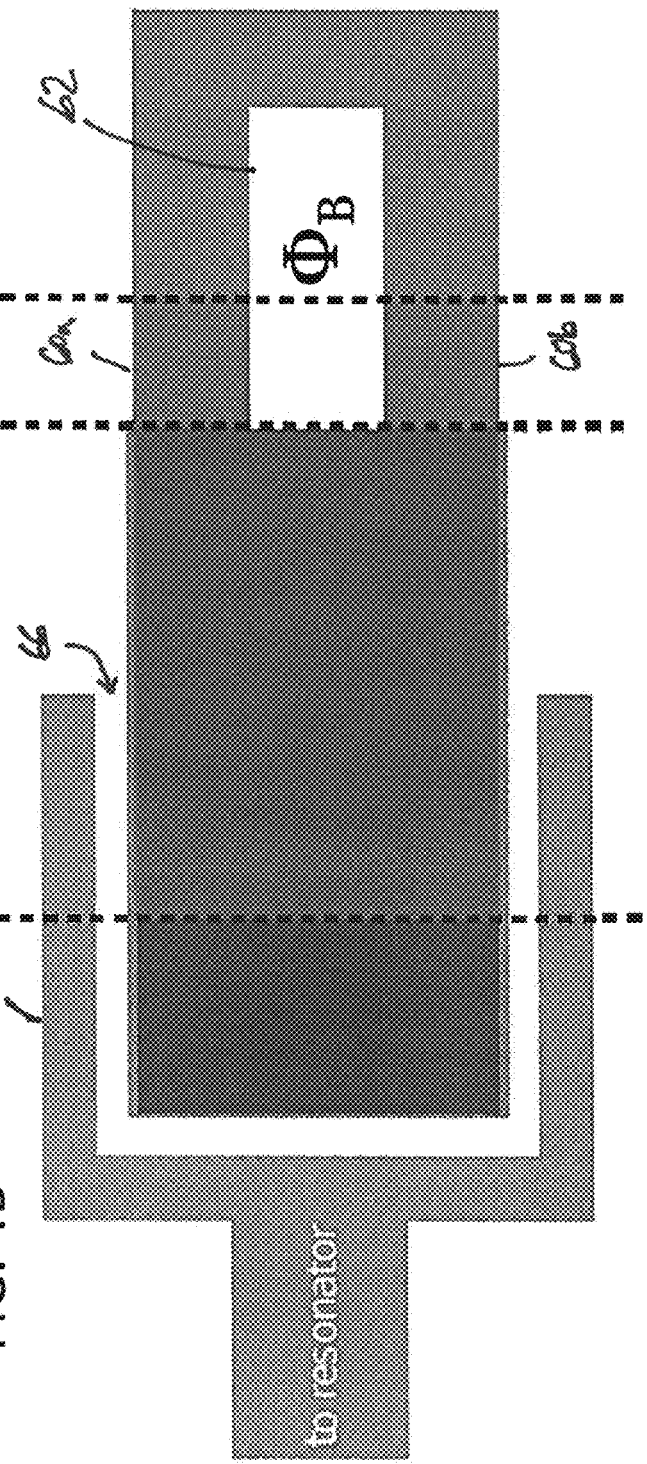

In FIGS. 4A and 4B (collectively "FIG. 4") are shown a side view and a top view, respectively, of a qubit 50 as a vdW heterostructure according to a second embodiment. The vdW heterostructure of the qubit 50 of FIG. 4 is different than that of the qubit 20 of FIG. 2, but the functional components are the same, as now explained. The qubit 50 shown in FIG. 4 is coupled to a resonator structure that is shown only in FIG. 4B, for clarity of visualization. However, it is appreciated that the coupling schemes are interchangable between the two Figures, and should not be regarded as a functional distinction between two designs.

The qubit 50 of FIG. 4 includes three sheets of vdW monolayers, like the qubit 20 of FIG. 2, albeit having a different structural configuration. Thus, the qubit 50 includes a first sheet 52 having a first plurality of monolayers of a TMD that exhibits superconductivity when cooled below a critical temperature. The qubit includes a third sheet 56 having a second plurality of monolayers of the TMD. Sandwiched between the first sheet 52 and the third sheet 56, the qubit 50 has a second sheet 54 of a dielectric insulator (e.g. hBN) having portions with different numbers of monolayers to provide structures to implement the different functions.

In particular, the second sheet 54 has a first portion 54a that is relatively thick (e.g. 30 nm) so that a portion of the TMD-hBN-TMD sandwich functions as a parallel plate capacitor 58. The second sheet 54 has a second portion 54b that is relatively thin (e.g. two or three monolayers only) so that a portion of the TMD-hBN-TMD sandwich functions as a Josephson junction 60. The main difference between the qubit 50 of FIG. 4 and the qubit 20 of FIG. 2 is that the first portion 54a of the second sheet in the former qubit has an extra thickness. In practice, the second sheet 54 may be made by combining two different hBN flakes with different thickness.

As with the qubit of FIG. 2, the qubit 50 of FIG. 4 may be etched or material otherwise removed therefrom to form a magnetic flux loop 62 for tuning, in which case two Josephson junctions 60a and 60b are formed, as illustrated more clearly in FIG. 4B. Also, the qubit 50 of FIG. 4 may be coupled to a portion 64 of a resonator circuit via a dielectric 66 (e.g. a gap), and the dimensions of the portion 64 and the dielectric 66 may be used to tune capacitive coupling of the qubit 50 to the remainder of the quantum device. Thus, the portion 64 of the resonator circuit may have an illustrative thickness of 250 nm, which is much taller in the side view than the entire qubit 50, and therefore is omitted from FIG. 4A for clarity.

Illustrative dimensions for the qubit 50 and its components are now given. A width of the qubit 50 may be about 6 μm. A length of the shunt capacitor (using portion 54a of the dielectric sheet 56) may be about 10 μm. A length of the Josephson junctions (using portion 54b of the dielectric sheet 56) may be about 1 μm. A width of each Josephson junction may have approximately the same dimension of 1 μm (i.e. if the width of the flux loop 62 is 4 μm). It is appreciated that embodiments of the teachings herein may include qubits 50 having other dimensions. It is further appreciated that the qubits and structures shown in FIGS. 2 and 4 also are illustrative only, and that other structures implementing qubits and other portions of quantum device circuitry may be fabricated as vdW heterostructures using the concepts and techniques described herein.

Figures 5A, 5B, 5C, 5D:
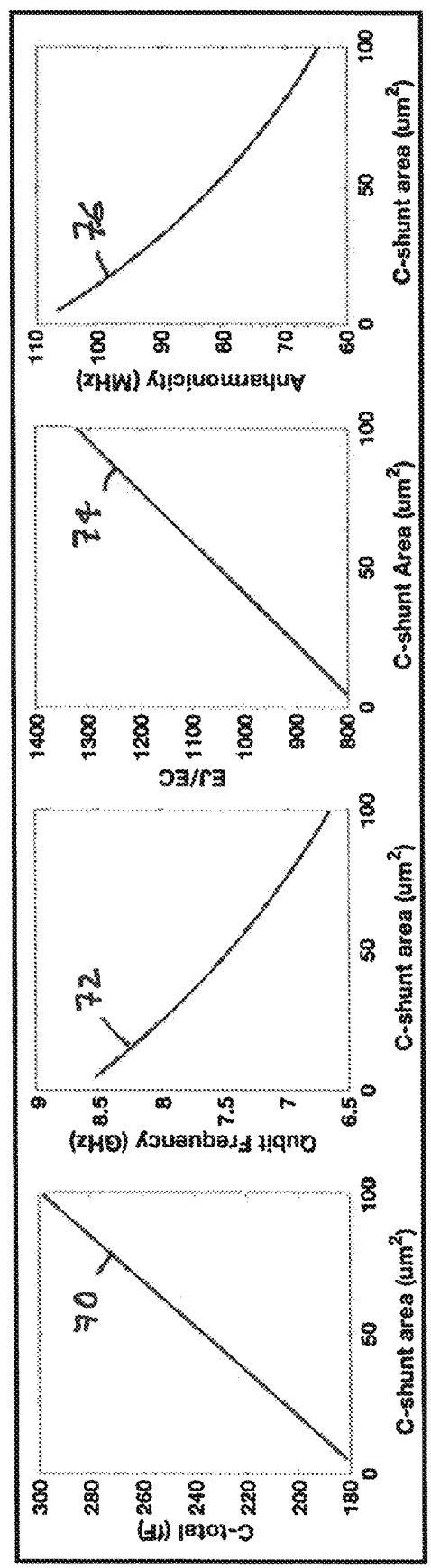
FIGS. 5A through 5D plot calculations of various electromagnetic properties of the second embodiment.

In FIGS. 5A through 5D are shown plots of calculations estimating electromagnetic properties of the qubit 50 embodiment of FIG. 4 as a function of shunt capacitor area. In these Figures, it is assumed that the TMD is niobium diselenide, and that total area of the Josephson junction is 2 square microns and is formed using 2 monolayers of hBN insulator. In FIG. 5A is shown a plot of estimated total capacitance 70 of the qubit 50, which for 60 square microns as shown in FIG. 4 is approximately 250 femtofarads (fF). In FIG. 5B is shown a plot of estimated qubit operating frequency 72, which for 60 square microns is approximately 7.25 gigahertz (GHz). In FIG. 5C is shown a plot of estimated charging ratio $E_J/E_C$ 74, which for 60 square microns is approximately 1100. And in FIG. 5D is shown a plot of estimated anharmonicity 76, which for 60 square microns is approximately 75 megahertz (MHz). It is appreciated that these plots are estimates only, and that embodiments of the concepts, techniques, and structures described herein may have different properties during operation, especially due to such factors as different design dimensions, different materials used in construction, and errors introduced due to manufacturing imprecision. That is, the calculation shown in the plots of FIGS. 5A through 5D is pertinent to a particular combination of materials and dimension, and the scaling and relevant numbers will change depending on the choice of materials and dimensions.

In the foregoing detailed description, various inventive features are grouped together in one or more individual embodiments for the purpose of streamlining the disclosure. This method of disclosure is not to be interpreted as reflecting an intention that the claims require more features than are expressly recited. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

We claim:

1. A qubit comprising:
    a first sheet having a first plurality of crystalline monolayers of a superconducting material;
    on a top surface of the first sheet, a second sheet having a first portion with a first number of crystalline monolayers of a dielectric and a second portion with a second number of crystalline monolayers of the dielectric, the first number being greater than or equal to the second number, wherein the second sheet adheres to the first sheet by van der Waals forces; and
    on a top surface of the second sheet, a third sheet having a second plurality of crystalline monolayers of the superconducting material, wherein the third sheet adheres to the second sheet by van der Waals forces;
    the first sheet, the first portion of the second sheet, and the third sheet together forming a parallel plate capacitor, and the first sheet, the second portion of the second sheet, and the third sheet together forming a Josephson junction.

2. The qubit of claim 1, wherein superconducting material comprises a transition metal dichalcogenide (TMD).

3. The qubit of claim 2, wherein the TMD has a chemical formula $MX_2$, M being niobium or tantalum, and X being selenium, sulfur, or tellurium.

4. The qubit of claim 2, wherein the TMD is niobium diselenide.

5. The qubit of claim 1, wherein the dielectric is electrically insulating.

6. The qubit of claim 1, wherein the dielectric comprises hexagonal boron nitride (hBN).

7. The qubit of claim 1, further comprising an electrical conductor resonantly coupled to the parallel plate capacitor.

8. The qubit of claim 1, wherein a portion of the material of the first, second, and third sheets has been removed to form a magnetic flux loop.

9. The qubit of claim 1, further comprising a fourth sheet of the insulator adhered to a bottom surface of the first sheet using van der Waals forces, and a fifth sheet of the insulator adhered to a bottom surface of the third sheet using van der Waals forces.

10. A method of manufacturing a qubit on a substrate polymer having a surface, the method comprising:
    forming, on the surface of the substrate polymer, a first sheet having one or more crystalline monolayers of a superconducting material;
    adhering, to a top surface of the first sheet using van der Waals forces, a second sheet having a first portion with a first number of crystalline monolayers of a dielectric and a second portion with a second number of crystalline monolayers of the dielectric, the first number being greater than or equal to the second number; and
    adhering, to a top surface of the second sheet using van der Waals forces, a third sheet having a second plurality of crystalline monolayers of the superconducting material;
    the first sheet, the first portion of the second sheet, and the third sheet together forming a parallel plate capacitor, and the first sheet, the second portion of the second sheet, and the third sheet together forming a Josephson junction.

11. The method of claim 10, wherein superconducting material comprises a transition metal dichalcogenide (TMD).

12. The method of claim 11, wherein the TMD has a chemical formula $MX_2$, M being niobium or tantalum, and X being selenium, sulfur, or tellurium.

13. The method of claim 11, wherein the TMD is niobium diselenide.

14. The method of claim 10, wherein the dielectric is electrically insulating.

15. The method of claim 10, wherein the dielectric comprises hexagonal boron nitride (hBN).

16. The method of claim 10, further comprising forming an electrical conductor resonantly coupled to the parallel plate capacitor.

17. The method of claim 10, further comprising removing a portion of the material of the first, second, and third sheets to form a magnetic flux loop.

18. The method of claim 17, wherein removing the portion comprises performing reactive ion etching.

19. The method of claim 17, further comprising tuning the qubit by passing a magnetic field through the flux loop.

20. The method of claim 10, further comprising adhering a fourth sheet of the insulator to a bottom surface of the first sheet using van der Waals forces, and adhering a fifth sheet of the insulator to a bottom surface of the third sheet using van der Waals forces.

\* \* \* \* \*